United States Patent [19]

Ovshinsky et al.

[11] Patent Number: 4,605,941
[45] Date of Patent: Aug. 12, 1986

[54] AMORPHOUS SEMICONDUCTORS EQUIVALENT TO CRYSTALLINE SEMICONDUCTORS

[75] Inventors: Stanford R. Ovshinsky, Bloomfield Hills; Masatsugu Izu, Birmingham, both of Mich.

[73] Assignee: Energy Conversion Devices, Inc., Troy, Mich.

[21] Appl. No.: 669,194

[22] Filed: Nov. 7, 1984

Related U.S. Application Data

[60] Continuation of Ser. No. 428,092, Sep. 29, 1982, Pat. No. 4,485,389, which is a continuation of Ser. No. 193,072, Oct. 10, 1980, abandoned, which is a continuation-in-part of Ser. No. 104,285, Dec. 17, 1979, abandoned, which is a division of Ser. No. 884,664, Mar. 8, 1978, Pat. No. 4,217,374.

[51] Int. Cl.[4] ............................................. H01L 45/00
[52] U.S. Cl. ............................................. 357/2; 357/4
[58] Field of Search ........................................ 357/2, 4

[56] References Cited

U.S. PATENT DOCUMENTS 4,485,389 11/1984 Ovskinsky .................................. 357/2

Primary Examiner—Martin H. Edlow
Attorney, Agent, or Firm—Marvin S. Siskind

[57] ABSTRACT

An amorphous semiconductor body, preferably a silicon-containing vapor deposited film, is provided containing at least fluorine as a compensating or altering and also an alloying agent, and most preferably at least one complementary compensating or altering agent, which reduce the localized defect states in the energy gap of the amorphous semiconductor material to a degree which either one alone could not achieve. As a result, the amorphous semiconductor body provides a higher photoconductivity, wider depletion width, more efficient change carrier collection, longer carrier lifetime, and lower dark intrinsic electrical conductivity, where desired, and can be more easily modified to shift the Fermi level to provide very efficient n type extrinsic electrical conductivity and the like than prior amorphous semiconductor bodies.

8 Claims, 12 Drawing Figures

AMORPHOUS SEMICONDUCTORS EQUIVALENT TO CRYSTALLINE SEMICONDUCTORS

RELATED APPLICATIONS

This is a continuation of U.S. Ser. No. 428,092 filed Sept. 29, 1982, now U.S. Pat. No. 4,485,389 which is a continuation of U.S. Ser. No. 193,072 filed Oct. 10, 1980, now abandoned, which is a continuation-in-part of U.S. Ser. No. 104,285 filed Dec. 17, 1979, now abondoned, which is a divisional of U.S. Ser. No. 884,664 filed Mar. 8, 1978, now U.S. Pat. No. 4,217,374.

BACKGROUND OF THE INVENTION

The invention relates to amorphous semiconductor films or other bodies with uniquely low defect states in the energy gap, such as dangling bonds, recombination centers, etc., to provide improved amorphous semiconductor films which have characteristics like those found in corresponding crystalline semiconductors. By the term "amorphous" is meant a material which has long range disorder, although it may have an ordered structure in the short or intermediate range order, or it may contain isolated domains having an ordered structure in a primarily amorphous matrix. The amorphous films involved have one of their most important applications in photovoltaic devices, and current control devices, such as various p-n junction devices such as p-i-n and m-i-s, devices, rectifiers, transistors or the like, where heretofore crystalline semiconductor bodies have been used in their fabrication.

The principles involved in the invention have their most important and useful application to amorphous silicon and silicon-alloy bodies, especially thin films of such materials, although many aspects thereof are also applicable to various other similar amorphous semiconductor bodies, and formed by elements including individual elements or mixtures or alloys of elements which have localized defect states in the energy gap which adversely affect certain desired electrical characteristics thereof.

Silicon is the basis of the huge crystalline semiconductor industry and is the material which has produced expensive high efficiency crystalline solar cells. Since amorphous silicon-containing films, if made equivalent to crystalline silicon films, would have many advantages over such crystalline silicon films (e.g. lower cost, larger area, easier and faster manufacture), the main purpose of this invention is to provide amorphous semiconductor bodies which have characteristics closely resembling those of corresponding crystalline materials.

When crystalline semiconductor technology reached a commercial state, it became the foundation of the present huge semiconductor device manufacturing industry. This was due to the ability of the scientist to grow substantially impurity-free germanium and particularly silicon crystals, and then turn them into extrinsic materials with p and n conductivity regions therein. This was accomplished by diffusing into such pure crystalline materials parts per million (i.e. less than 1 percent) of donor or acceptor dopant materials introduced as substantial impurities into the substantially pure crystalline materials, to increase their electrical conductivity and to control their being either of a p or n conduction type. The fabrication processes for making p-n junction and photoconductive crystals involve extremely complex time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants. These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material has all resulted in a serious economic barrier to the large scale use of crystalline semiconductor solar cells for energy conversion. Fabricating transistor-like p-n junction, photoconductive or solar cell devices from polycrystalline materials has also been found unsatisfactory for reasons including those applicable to devices made from single crystalline materials, as well as adding defect states and the problems caused by such things as grain boundaries.

Accordingly, a considerable effort has been made to develop processes for readily depositing amorphous semiconductor films, each of which can encompass relatively large areas, if desired, limited only by the size of the deposition equipment, and which could be readily doped to form p and n junctions. For many years such work was substantially unproductive. Amorphous silicon or germanium (Group IV) films were found to have microvoids and dangling bonds and other defects which produce a high density or localized undesired defect states in the energy gap thereof. The presence of a high density of localized defect states in the energy gap of amorphous silicon semiconductor films results in a low degree of photoconductivity and short diffusion lengths, making such films unsuitable for solar cell applications. Additionally, such films cannot be successfully doped or otherwise modified to shift the Fermi level close to the conduction of valence bands, making them unsuitable for making p-n junctions for solar cell and current control device applications.

W. E. Spear and P. G. Le Comber of Carnegie Laboratory of Physics, University of Dundee, in Dundee, Scotland, did some work or "Substitutional Doping of Amorphous Silicon", as reported in a paper published in Solid State Communications, Vol. 17, pp. 1193–1196, 1975. As there reported an amorphous silicon film was formed by glow discharge deposition of silane ($SiH_4$) gas in the presence of a doping gas of phosphine ($PH_3$) for n-type conduction or a gas of diborane ($B_6H_6$) for p-type conduction. These gases were premixed and passed through a reaction tube where the gaseous mixture was decomposed by an r.f. glow discharge and deposited on a substrate at a high substrate temperature of about 350°–600° K. The material so deposited on the substrate was an amorphous silicon host matrix material where the phosphorous or boron formed dopants in the silicon host matrix material in concentrations between about $5 \times 10^{-6}$ and $10^{-2}$ parts per volume. When the localized defect states in the energy gap of the undoped form of these materials were measured it was found that the density of localized defect states in the energy gap thereof was substantially reduced from that previously measured for other amorphous silicon films deposited by other processes. However, a much more substantial reduction in the minimum density of these localized defect states was necessary to bring the electrical characteristics of amorphous silicon materials much closer to those of corresponding crystalline materials.

It was not originally known by these researchers that the silicon films they deposited were, instead of relatively pure amorphous silicon films, an alloy of silicon and hydrogen and that the hydrogen alloyed with the silicon to eliminate many of the localized defect states.

Thus, after this initial development of the glow discharge deposition of silicon from silane gas was carried out, work was done by others of the sputter depositing of amorphous silicon films in an atmosphere of argon (required by the sputtering deposition process) and molecular hydrogen, to determine the results of such molecular hydrogen on the characteristics of the deposited amorphous silicon film. This research indicated that the hydrogen acted as a compensating agent to reduce the localized defect states of the energy gap. However, the degree of reduction in the density of localized defect states achieved by this sputter deposition process was less than that achieved by the silane deposition process described above (as would be expected since sputter and evaporation deposition processes inherently produce amorphous films with much higher densities of localized states than does a glow discharge deposition process). This is the reason that it was not believed that sputter or evaporation deposition processes could successfully produce amorphous semiconductor films functionally equivalent to similar crystalline materials used in solar cells and current control devices. Also, the sputtering process must be carried out under certain critical partial pressure limitations, and since such partial pressures are effected both by the amount of argon and hydrogen gas present, the amount of molecular hydrogen gas which could be introduced into the sputtering atmosphere was accordingly limited.

The difficulty encountered heretofore in reducing the density of localized defect states in the energy gap of amorphous semiconductor materials like silicon and others to desirably low levels, so that these materials are more nearly equivalent of corresponding crystalline materials, is believed to be explainable in the following manner. At or near the Fermi level of these materials deposited, for example, by the glow discharge of silane, are two bumps of relatively high density states in the energy gap which are apparently related to the remaining dangling bond density. They are located substantially at about 0.4 eV below the conduction band $E_c$ and above the valence band $E_v$. When the glow discharge amorphous silicon is doped with phosphorus or boron, the Fermi level is believed to be moved up or down, but the density of localized states was so high that the dopant could not move the Fermi level close enough to the conduction or valence bands to have an effective p or n junction. Thus, the activation energy for the doped glow discharge amorphous silicon was not lowered below about 0.2 eV. This result also placed a theoretical limitation on the open-circuit photovoltage of a p-n junction of doped glow discharge amorphous silicon, since the internal field cannot exceed the separation of the Fermi level in the p and n type regions. In addition, the remaining activation energy limits the room-temperature DC conduction of the doped glow discharge amorphous silicon and the material would have a large sheet resistance if it were made into a large area array, the resistance not being helped by the rather low carrier mobility which is a factor of about $10^4$–$10^5$ less than that for crystalline silicon. Also, where it is desirable to modify an amorphous silicon film to form an effective ohmic interface, for example, between an intrinsic (undoped) portion thereof and an outer metal electrode, such modified portions of the film must have a very high conductivity. The prior methods of doping such films which do not provide as useful an ohmic interface as in the case of the films of the invention to be described.

The silane glow discharge deposition of silicon films has some limitations in addition to the less than ideal reduction of the density of localized defect states in the energy gap achieved thereby. For example, such a process requires silane, which is a relatively expensive starting material. Also, the structure of such a film and electrical characteristics can vary with the amount of photon absorption therein, and the film is soft and easily scratched or otherwise physically damaged.

The present invention provides an amorphous semiconductor material, like silicon, with a much lower minimum density of localized defect states than was heretofore obtained, to provide more efficient photoconductive and photovoltaic devices. Thus, by providing a much lower density of defect states, the present invention increases carrier lifetime and depletion layer thickness. Also, it enables the amorphous silicon and other materials to be more efficiently modified by the addition of modifying materials thereto.

There has recently issued U.S. Pat. No. 4,196,438 to D. E. Carlson. This patent appears to have as its objective the making of amorphous silicon bodies by glow discharge in a gas atmosphere much less expensive than silane. The patent states that this less expensive gas includes the elements silicon and a halogen selected from the group consisting of chlorine, bromine and iodine. Examples of the deposition gas given are dichlorosilane ($SiH_2Cl_2$), chlorosilane ($SiH_3Cl$), trichlorosilane ($SiHCl_3$), bromosilane ($SiH_3Br$), dibromosilane ($SiH_2Br_2$) and silicon tetrachloride ($SiCl_4$) with particular emphasis placed on dichlorosilane. Notably and importantly, no reference is made to fluorine. While a comparison is made in this patent between the characteristics of the amorphous silicon devices disclosed therein and the prior sputtered amorphous silicon devices, just as comparisons are made in the prior Carlson U.S. Pat. No. 4,064,521 between the prior amorphous silicon devices fabricated by glow discharge in silane and amorphous silicon devices fabricated by sputtering, there is no reference in U.S. Pat. No. 4,196,438 to any reduced density of localized defect states over that achieved by the use of silane, as is achieved by the present invention. The reduction of this crucial parameter is one of the most important contributions of the present invention.

DESCRIPTION OF THE INVENTION

The present invention has to do with the formation of an amorphous semiconductor body, preferably a silicon-containing vapor deposited film, containing at least fluorine as a compensating or altering agent, and most preferably at least one complementary compensating or altering agent such as hydrogen, both of which reduce the localized defect states in the energy gap of the amorphous semiconductor material to a degree which either one alone could not achieve. (The term "compensating or altering agent" refers to a material which neutralizes dangling, bonds and the like. An altering agent is a compensating material which may combine with the host matrix in amounts sufficient to form an alloy with the host matrix.) As a result, the amorphous semiconductor body provides a higher photoconductivity, wider depletion width, more efficient charge carrier collection, longer carrier lifetime, and lower dark intrinsic electrical conductivity, where desired, and can be more easily modified to shift the Fermi level to provide very efficient n-type extrinsic electrical conductivity and the like than prior amorphous semiconductor bodies. In most cases, the compensating or altering agents form an alloy and chemically bond with the host matrix material in a manner further to lower the density of localized defect states in the energy gap. Fluorine compensated amorphous semiconductor materials act more like crystalline materials and are more useful in photoconductive and photovoltaic devices like solar cells and photoreceptor devices, and in current controlling devices, including p-n junction rectifiers transistors and the like. In the case of silicon materials, the density of localized defect states is reduced at least by a factor of 10 or more from what was heretofore achieved, so that the minimum density of the defect states is no greater than $10^{16}$ per cubic centimeter per eV.

While the broader aspects of the invention envision the compensation or alteration of an amorphous semiconductor silicon-containing body or the like with compensating or altering agents in a separate environment from the environment in which the body is formed, it is believed that the compensation or alteration of an amorphous film formed by vapor deposition equipment can be best achieved by injecting at least fluorine into the amorphous semiconductor film more advantageously as it deposits on the substrate in the enclosure of the deposition equipment. By the term "vapor deposition" is meant a deposition where a material in a vaporized state is deposited on a substrate. Such depositions are formed by sputtering, glow discharge and evaporation processes. The amounts of the compensating or altering agents including fluorine are selected to achieve the best results for the intended use of the particular film involved.

In the case of silicon bodies, when a compensating or altering agent in addition to fluorine is used, the second agent is most advantageously hydrogen. In vapor deposition processes the compensating or altering agents are most desirably introduced in the film involved in an activated form (e.g. atomic, free radical or ionic forms thereof) which are preferably activated in the vicinity of the substrate upon which the amorphous semiconductor film is depositing, so that the one or more compensating or altering agents reduce the localized defect states involved in the most efficient and effective manner possible. Such activated hydrogen and fluorine, for example, can be produced by passing the molecular gas involved over a heated tungsten filament, or by decomposing the molecular gas to produce a plasma between a pair of electrodes connected to a high DC or radio frequency (RF) voltage. The compensating or altering agent activating means are preferably placed contiguous to the substrate upon which the semiconductor film is being deposited, since the lifetime of these actuated materials is generally relatively short. Still another method of producing activated gases is to irradiate the compensating agents, preferably at the location of the depositing amorphous semiconductor film, with radiant energy like ultraviolet light. If a device containing a p or n region is to be formed, a desired one or more modifying agents, like dopants, can be fed to the depositing film to form one or more n and/or p conductivity regions within the depositing film.

In the case where fluorine and hydrogen are used to compensate or alter a silicon-containing body, it is believed that the activated hydrogen is effective in reducing the localized states in the energy gap at or near the Fermi level, while the activated fluorine further reduces these states as well as other states between those near the Fermi level and the conduction band. The activated fluorine especially readily diffuses into the bonds to the amorphous silicon in the matrix body, substantially to decrease the density of localized defect states therein, because the small size of the fluorine atoms enables them to be readily introduced into the amorphous silicon matrix. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Because of its exceedingly small size, high reactivity, specificity in chemical bonding, and highest electronegativity, fluorine is qualitatively different from other halogens and so is considered a super-halogen. These factors make fluorine an extremely efficient compensating and altering agent.

In one embodiment of the invention in which the compensating and altering elements are fluorine and another element, such as hydrogen, compensation of dangling bonds and the like is achieved with the addition to the amorphous films of very small quantities of fluorine and hydrogen (e.g., fractions of one atomic percent of the amorphous host matrix material involved). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the new alloy so formed has a lower density of defect states in the energy gap than that achieved by the mere neutralization of dangling bonds and similar defect states. Such larger amount of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen contributes while acting as a density of states reducing element. The ionic role that fluorine plays in such an alloy is believed to be an important factor in terms of the nearest neighbor relationships.

In any amorphous semiconductor body the Fermi level cannot be moved almost completely to the valence or conduction band needed to make a good p-n junction unless a very low density of localized states is present. In the attempted doping of the silane glow discharge deposition of silicon films above described with an n-conductivity dopant, the Fermi level was moved to only within 0.2 eV of the conduction band. In the present invention, for example, the addition of an n-conductivity dopant, like arsenic, to an amorphous silicon body moves the Fermi level substantially all of the way to the conduction band. The addition of an n-dopant like arsenic to an amorphous silicon film shifts the Fermi level to a point near the conduction band because it is believed that the addition of activated hydrogen substantially reduces the localized states at or near the Fermi level and the addition of fluorine substantially reduces the density of localized defect states between those at or near the Fermi level and the conduction band. Therefore, a good n-conductivity amorphous silicon film results from such compensation of the body.

The production of highly efficient solar cells requires long drift lengths so that a large number of charge carriers can be separated and collected in response to the reception of photons. This requires a large depletion region in the amorphous semiconductor body which is a thin film in such an application. The comparable depletion region is obtained in an intrinsic film when there is a low density of localized states producing a low dark conductivity in the amorphous semiconductor film. Such an amorphous semiconductor film is useful in a Schottky barrier solar cell. However, when it is desired to form a p-i-n or p-n junction solar cell, it is necessary to add dopant conduction modifying agents to move the Fermi level substantially towards the valence and conduction bands to form effective solar cell p and n regions. In such case, a relatively small amount of dopant is added to the film, so that a sufficiently wide depletion region is maintained. As previously indicated, a low density of localized defect states (with an accompanying low density of recombination centers) enables the amorphous semiconductor film involved to be effectively doped, thusly to form such effective p and n junctions useful in photocells. To increase the photoconductive properties of amorphous semiconductor films further, the low density of localized states makes readily possible also the addition of sensitizing agents like zinc and copper to increase carrier lifetime. If a high dark conductivity is desired, much larger amounts of the conduction modifying agent would generally be added to the portion of the film involved.

In summary, to bring the significance of the present invention into focus, it is believed that the present invention provides amorphous semiconductor bodies which are more like crystalline bodies than heretofore achieved for use in the manufacture of photoconductive and photovoltaic devices and p-n junction current control devices and the like, despite the previously accepted dogma that amorphous semiconductor materials could not be produced in a manner to be similar to their crystalline counterparts. Additionally, the present invention provides large area, high yield, low cost amorphous semiconductor bodies which provide maximum recombination site compensation, charge carrier separation, and collection for solar cells and, therefore, produce such high energy conversion efficiencies that they should materially contribute to the solution of the energy shortage problems confronting the world to a greater degree each year.

The above-described and other objects, advantages, and features of the invention will become more apparent upon making reference to the specification to follow, the claims and the drawings.

DESCRIPTION OF EXEMPLARY FORMS OF THE INVENTION SHOWN IN DRAWINGS

Figure 1:
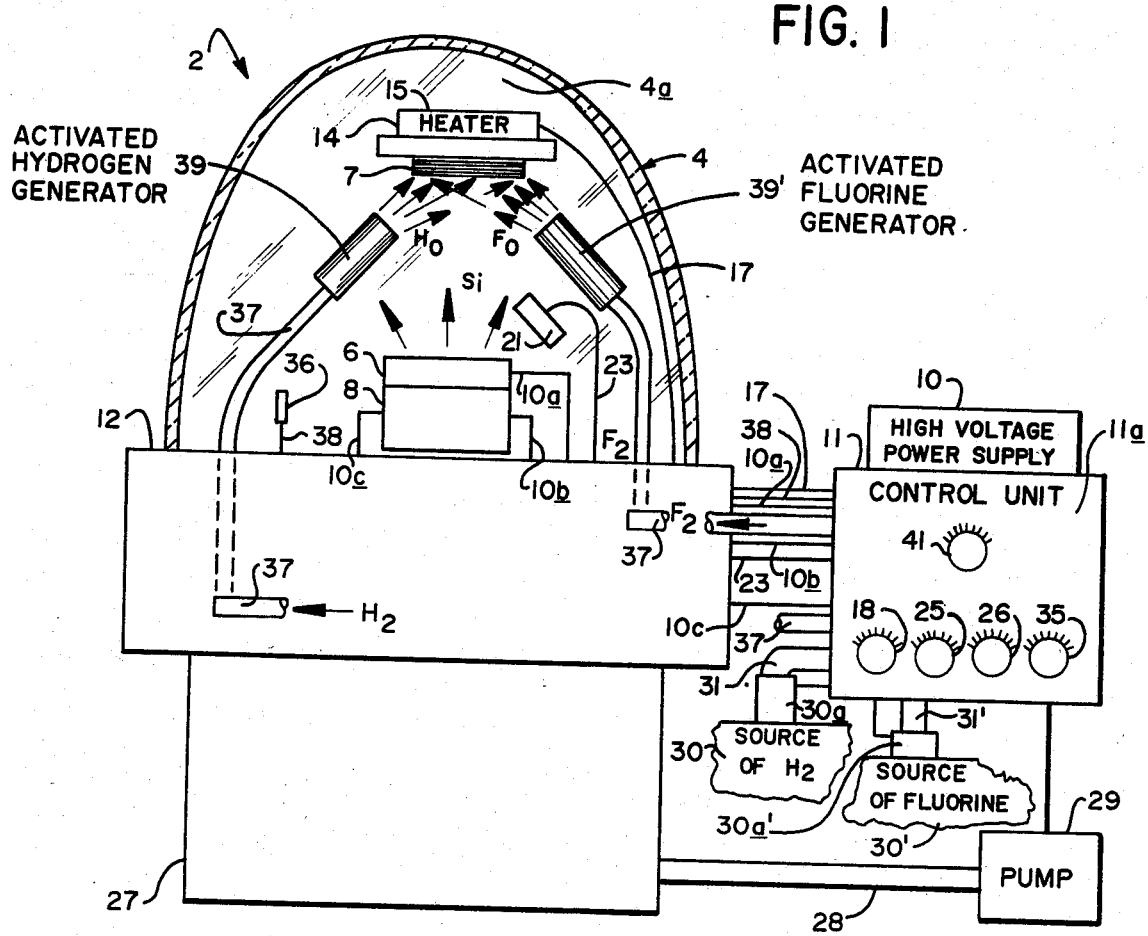
FIG. 1 is a diagrammatic representation of more or less conventional evaporation deposition equipment to which has been added molecular hydrogen and fluorine inlets and activated hydrogen and fluorine generating units which heat and decompose the molecular hydrogen and fluorine within the evacuated space of the vapor deposition equipment, to produce activated species such as atomic hydrogen and fluorine and to direct the same against the substrate during the deposition of an amorphous silicon film.

Refer now more particularly to FIG. 1 where is shown vapor deposition equipment generally indicated by reference numeral 2, which may be conventional vapor deposition equipment to which is added activated compensating or altering agent injecting means to be described. This equipment, as illustrated, includes a bell jar 4 enclosing an evacuated space 4a in which is located one or more crucibles like crucible 6 containing the amorphous semiconductor film-producing element or elements to be deposited on a substrate 7. In the best exemplary form of the invention being described, the crucible 6 intially contains ground-up silicon for forming an amorphous silicon film on substrate 7 which, for example, may be a metal, crystalline semiconductor or other material upon which it is desired to form the film to be deposited by the process of the present invention. An electron beam source 8 is provided adjacent to the crucible 6, which electron beam source diagrammatically illustrated usually includes a heated filament and beam deflection means (not shown) which directs a beam of electrons at the silicon contained in the crucible 6 to evaporate the same. A high voltage DC power supply 10 provides a suitable high voltage, for example, 10,000 volts DC, the positive terminal of which is connected through control unit 11 and conductor 10a to the crucible 6 and the negative terminal of which is connected through the control unit 11 and conductor 10b to the filament of the electron beam source 8. The control unit 11 including relays or the like for interrupting the connection of the power supply 10 to the conductors 10a–10b when the film thickness of a film deposition sampling unit 21 in the evacuated space 4a reaches a given value set by operating a manual control 25 on a control panel 11a of the control unit 11. The film sampling unit 21 has a cable 23 which extends to the control unit 11 which includes well known means for responding to both the thickness of the film deposited upon the film sampling unit 21 and the rate of deposition thereof. A manual control 26 on the control panel 11a may be provided to fix the desired rate of deposition of the film controlled by the amount of current fed to the filament of the electron beam source through conductor 10c in a well known manner.

The substrate 7 is carried on a substrate holder 14 upon which a heater 15 is mounted. A cable 17 feeds energizing current to heater means 15 which controls the temperature of the substrate holder 14 and substrate 7 in accordance with a temperature setting set on a manual control 18 on the control panel 11a of the control unit 11.

The bell jar 4 is shown extending upwardly from a support base 12 from which the various cables and other connections to the components within the bell jar 4 may extend. The support base 12 is mounted on an enclosure 27 to which connects a conduit 28 connecting to a vacuum pump 29. The vacuum pump 29, which may be continuously operated, evacuates the space 4a within the bell jar 4. The desired pressure for the bell jar is set by a control knob 35 on the control panel 11a. In the most preferred form of the invention, this setting controls the pressure level at which the flow of activated hydrogen and fluorine into the bell jar 4 is regulated. Thus, if the control knob is set to a bell jar pressure of $10^{-4}$ torr., the flow of hydrogen and fluorine into the bell jar 4a will be such as to maintain such pressure in the bell jar as the vacuum pump 29 continues to operate.

Sources 30 and 30' of molecular hydrogen and fluorine are shown connected through respective conduits 31 and 31' to the control unit 11. A pressure sensor 36 in the bell jar 4 is connected by a cable 38 to the control unit 11. Flow valves 30a and 30a' are controlled by the control unit 11 to maintain the set pressure in the bell jar. Conduits 37 and 37' extend from the control unit 11 and pass through the support base 12 into the evacuated space 4a of the bell jar 4. Conduits 37 and 37' respectively connect with activated hydrogen and fluorine generating units 39 and 39' which convert the molecular hydrogen and fluorine respectively to activated hydrogen and fluorine, which may be atomic and/or ionized forms of these gases. The activated hydrogen and fluorine generating units 39 and 39' may be heated tungsten filaments which elevate the molecular gases to their decomposition temperatures or a plasma generating unit well known in the art for providing a plasma of decomposed gases. Also, activated hydrogen and fluorine in ionized forms formed by plasma can be accelerated and injected to the depositing film by applying an electric field between the substrate and the activating source. In either event, the activated hydrogen and fluorine generator units 39 and 39' are preferably placed in the immediate vicinity of the substrate 7, so that the relatively short-lived activated hydrogen and fluorine delivered thereby are immediately injected into the vicinity of the substrate 7 where the silicon film is depositing.

As previously indicated, to produce useful amorphous silicon films which have the desired characteristics for use in solar cells, p-n junction current control devices, etc., the compensating agents produce a very low density of localized defect states in the energy gap without changing the basic intrinsic character of this film. Compensation of dangling bonds and the like is achieved with the addition to the amorphous films of hydrogen and fluorine of far less than one atomic percentage of the amorphous composition involved. The amount of fluorine and hydrogen most desirably used forms a silicon-hydrogen-fluorine alloy, where both the hydrogen and fluorine may constitute well in excess of even one atomic percentage of the alloy, such as about 5 atomic percent or more thereof.

This result is still achieved with relatively small amounts of activated hydrogen and fluorine so that the pressure in the evacuated bell jar space 4a can still be a relatively low pressure (like $10^{-4}$ torr). The pressure of the gas in the generator can be higher than the pressure in the bell jar by adjusting the size of the outlet of the generator.

The temperature of the substrate 7 is adjusted to obtain the maximum reduction in the density of the localized defect states in the energy gap of the amorphous semiconductor film involved. The substrate surface temperature will generally be such that it ensures high mobility of the depositing materials, and one below the crystallization temperature of the depositing film.

Figure 2:
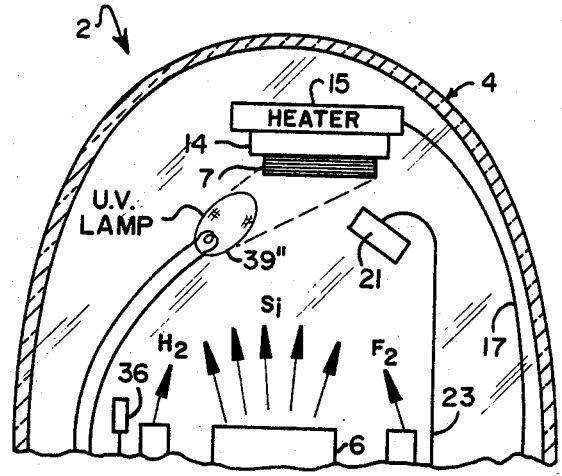
FIG. 2 illustrates vacuum deposition equipment like that shown in FIG. 1, with activated hydrogen and fluorine generating means comprising an ultraviolet light source irradiating the substrate during the process of depositing the amorphous silicon film, such light source replacing the activated hydrogen and fluorine generator units shown in FIG. 1.

The surface of the substrate can be irradiated by radiant energy to further increase the mobility of the depositing material, as by mounting an ultraviolet light source (not shown) in the bell jar space 4a. Alternatively, instead of the active hydrogen and fluorine generator units 39 and 39' in FIG. 1, these units can be replaced by an ultraviolet light source 39" shown in FIG. 2, which directs ultraviolet energy against the substrate 7. This ultraviolet light will decompose the molecular hydrogen and fluorine both spaced from and at the substrate 7 to form activated hydrogen which diffuses into the depositing amorphous semiconductor film condensing on the substrate 7. The ultraviolet light also enhances the surface mobility of the depositing material.

Figure 3:
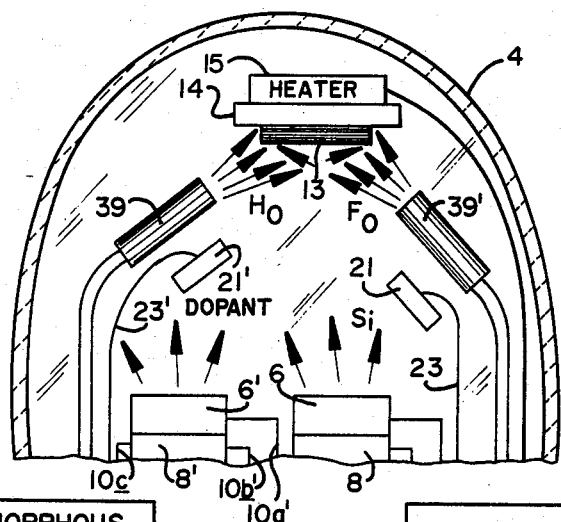
FIG. 3 illustrates the vacuum deposition equipment of FIG. 1 to which has been added additional means for doping the depositing silicon film with a n or p conductivity producing material.

Refer now to FIG. 3 which illustrates additions to the equipment shown in FIG. 1 for adding modifiers to the depositing film. For example, a n-conductivity dopant, like phosphorus or arsenic, may be initially added to make the intrinsically modest n-type silicon film a more substantially n-type film, and then a p-dopant like boron, aluminum, gallium or indium may be added to form good p and n regions within the film. The order of depositing such regions can obviously be reversed. A crucible 6' is shown for receiving a dopant like arsenic which is evaporated by bombarding the same with an electron beam source 8', like the beam source 8 previously described. The rate at which the dopant evaporates into the atmosphere of the bell jar 4, which is determined by the intensity of the electron beam produced by the electron beam source 8', is set by a manual control 41 on the control panel 11a, which controls the current fed to the filament forming part of this beam source to produce the set evaporation rate. The evaporation rate is measured by a film thickness sampling unit 21' upon which the dopant material deposits and which generates a signal on a cable 23' extending between the unit 21' and control unit 11, which indicates the rate at which the dopant material is deposited on the unit 21'.

After the desired thickness of the doped silicon film having the desired degree of p or n conductivity has been deposited, evaporation of silicon without any dopant can be carried out if an intrinsic region is desired. Where a region of opposite conductivity type is desired, the crucible 6' (or another crucible not shown) is provided with the opposite conductivity type dopant, and the amorphous and dopant deposition process then proceeds as before to increase the thickness of the amorphous semiconductor film with the desired conductivity region therein.

The principles of this invention have their most important utility in amorphous silicon alloy films, including silicon and other Group IV elements having normal tetrahedral bonding and three-dimensional stability, especially germanium. Other amorphous alloys which have bonding configurations with fluorine and hydrogen or the like analogous to those existing in the alloys described above are also to be encompassed within the present invention.

In the case where the amorphous semiconductor films comprise two or more elements which are solid at room temperature, then it is usually desirable to separately vaporize each element placed in a separate crucible, and control the deposition rate thereof in any suitable manner, as by setting controls on the control panel 11 which, in association with the deposition rate and thickness sampling units, controls the thickness and composition of the depositing film.

While activated fluorine with activated hydrogen is believed to be the most advantageous for use in compensating and altering amorphous semiconductor films like silicon, in accordance with broader aspects of the invention, other similar acting compensating and altering agents other than hydrogen may be useful. For example, oxygen is useful in reducing the density of localized defect states in the energy gap.

As previously indicated, although it is preferred that compensating, altering and other modifying agents be incorporated into the amorphous semiconductor film involved as it is deposited, in accordance with another aspect of the invention, the amorphous film deposition process and the process of injecting all the compensating or altering and modifying agents into the semiconductor films can be wholly or partially done in a completely separate environment from that wherein the depositing of the amorphous film takes place. This can have an advantage in certain applications since the conditions for injecting one or more of such agents are then completely independent of the conditions for film deposition or the introduction of another compensating or altering agent which may have taken place during film deposition. Thus, it may be found desirable to add the fluorine at a high temperature and during or after film deposition at high temperatures where hydrogen would not bond or remain bonded to the silicon or other amorphous semiconductor elements. The fluorine and hydrogen are then introduced separately under different substrate temperature conditions. Thus, it is known that hydrogen addition in an alloy including a silicon film can only be efficiently accomplished at temperatures below about 400° C., whereas efficient fluorine addition can take place at much higher temperatures. Therefore, in accordance with an alternative form of the invention, fluorine addition is first carried out at substrate temperature near or approaching the crystallization temperature of silicon, namely 650° C., such as during a vapor deposition of the silicon film while the fluorine is activated in any manner desired, and then carrying out hydrogen compensation at a much lower substrate temperature, preferably such as a temperature in the range of 200° C. to 400° C., and preferably about 300° C.

Figure 4:
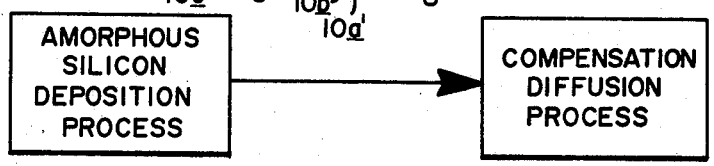
FIG. 4 illustrates an application of the present invention wherein the deposition of the amorphous silicon film and the application of the activated hydrogen and fluorine are carried out as separate steps and in separate enclosures.
Figure 5:
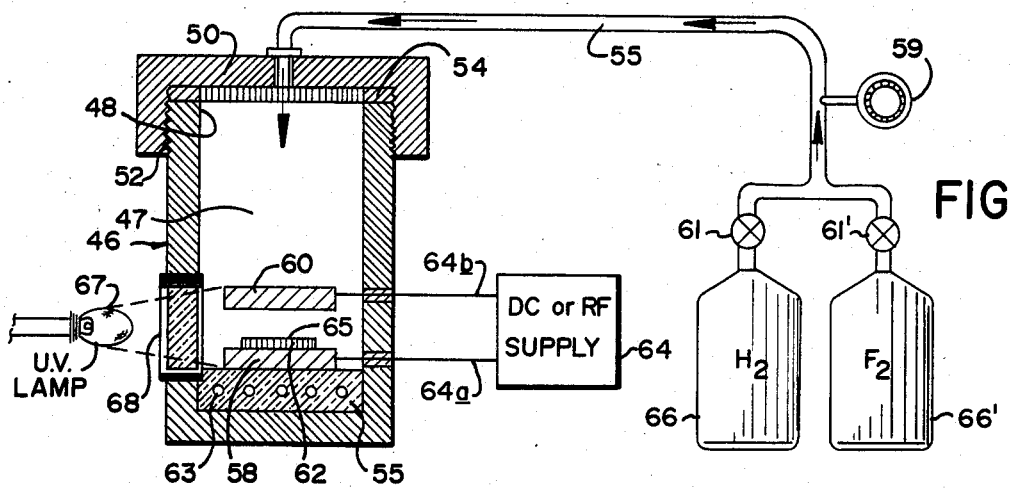
FIG. 5 illustrates exemplary apparatus for diffusing activated hydrogen and or fluorine into a previously deposited amorphous silicon film.

FIGS. 4 and 5 illustrate the addition of both hydrogen and fluorine in a completely different environment from the film deposition environment, FIG. 5 illustrating apparatus for carrying out the addition of hydrogen and/or fluorine in a diffusion process. As there shown, a low pressure evacuated container body 46 is provided which has a chamber 47 having an opening 48 at the top thereof. This opening 48 is closed by a cap 50 having threads 52 which thread around a corresponding threaded portion on the exterior of the container body 46. A sealing O-ring is sandwiched between the cap 50 and the upper face of the container body. A sample-holding electrode 58 is mounted on an insulating bottom wall 55 of chamber 47. A substrate 62 upon which an amorphous semiconductor film 65 has already been deposited is placed on the electrode 58. The upper face of the substrate 62 contains the amorphous semiconductor film 65 to be compensated or altered in the manner now to be described.

Spaced above the substrate 62 is an electrode 60. The electrodes 58 and 60 are connected by cables 64a and 64b to a DC of RF supply source 64 which supplies a voltage between the electrodes 58 and 60 to provide an activated plasma of the compensating or altering gas or gases fed into an evacuated chamber 47. FIG. 5 illustrates molecular hydrogen and/or fluorine being fed into the chamber 47 from different independently volume-controllable tank sources 66 and 66' thereof by an inlet conduit 56 extending from the sources 66 and 66' and passing through the cap 50. The conduit 56 is shown connected to valves 61 and 61' of the tanks 66 and 66'. A pressure indicating guage 59 is shown connected to the inlet conduit 56 beyond the valves 61 and 61'.

Suitable means are provided for heating the interior of the chamber 47. Where only hydrogen is involved, the substrate temperatures are well below the crystallization temperature of silicon if the film is a silicon film, because hydrogen does not bond well with silicon at temperatures much above about 350°–400° C. When only fluorine is involved, however, the substrate temperature is elevated preferably to a temperature below but near or approaching the crystallization temperature of the film 64. For heating the substrate, coils of heating wire 63 are shown in the bottom wall 55 of the chamber 47, to which coils connect a cable (not shown) passing through the walls of the container body 46 to a source of current for heating the same. When hydrogen and fluorine are used together, the preferred substrate temperature is about 300° C.

The combination of a preferably high temperature, where only fluorine is involved, and, in any event, the elevated temperature involved and a plasma of the compensating agent gas developed between the electrodes 58 and 60 achieve a number of desired results. First of all, the compensating or altering gas fed into the chamber 47 is activated between the electrodes 58 and 60. The activated gas so produced under the high temperature present conditions described readily diffuses into the thin amorphous semiconductor film (which, for example, may be on the order of 1 micron thick, or less). Also, the elevated temperature conditions plus the diffusion of the activated gas into the semiconductor film 65 reduces the porous structure of the film. Any molecular gas which initially diffuses into the amorphous semiconductor film 65 will be activated also by the electric field in which the film 65 is located. The compensating or altering and pore-reducing effect of the gas in the amorphous semiconductor film 65 can be further enhanced by irradiating the amorphous semiconductor film 65 with radiant energy from an ultraviolet light source 67, which is shown outside of the container body 46 directing ultraviolet light between the electrodes 58 and 60 through a quartz window 68 mounted in the side wall of the container body 46.

As previously indicated, the present invention provides photoconductive and readily modifiable amorphous semiconductor films where the localized defect states of the energy gap are of much lower than heretofore achieved and with greatly improved photoconductivity and low internal resistance or large internal resistance, as desired.

Figure 6:
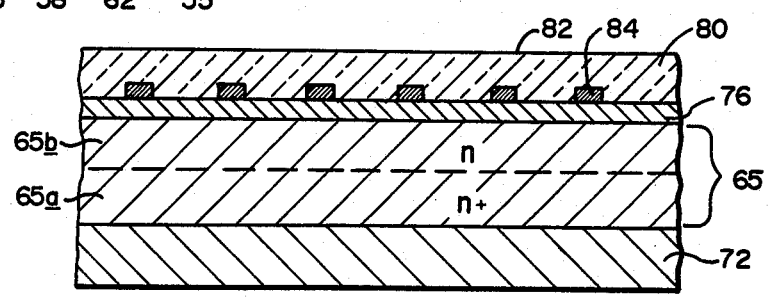
FIG. 6 is a fragmentary sectional view of one embodiment of a solar cell to illustrate one application of the amorphous semiconductor photoconductive film of the invention.
Figure 7:
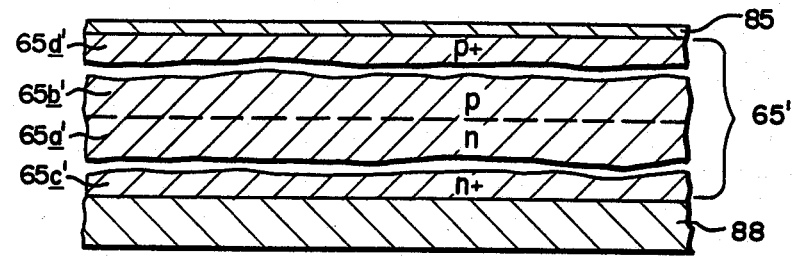
FIG. 7 is a fragmentary sectional view of a p-n junction solar cell device which includes a doped amorphous semiconductor film of the invention.

Various applications of the improved amorphous semiconductor films produced by the unique processes of the invention are illustrated in FIGS. 6 through 12. FIG. 6 shows a Schottky barrier solar cell in fragmentary cross-section. The solar cell illustrated includes a substrate 72 of a material having good electrical conductivity properties, and the ability of making an ohmic contact with an overlying amorphous silicon film 65 compensated or altered to provide a low density of localized states in the energy gap. The substrate 72 may comprise a low work function metal, such as aluminum, tantalum, stainless steel or other material matching with the amorphous semiconductor film 65 deposited thereon, which is preferably a silicon-containing alloy, like a silicon-germanium alloy, altered in a manner of the silicon films previously described, so that it has a low density of localized states in the energy gap of no more than $10^{16}$ per cubic centimeter per eV and preferably less. It is most preferred that the film have a region 65a next to the electrode 72, which region forms a n-plus conductivity, heavily doped, low resistance interface between the electrode 72 and an undoped relatively high dark resistance region 65b which has an intrinsic low n-conductivity.

The upper surface of the amorphous semiconductor film 65 as viewed in FIG. 6 joins a metallic region 76, the interface between this metallic region 76 and the amorphous semiconductor film 65 forming a Schottky barrier. The metallic region 76 is transparent or semi-transparent to solar radiation, has good electrical conductivity and is of a high work function (for example, 4.5 eV or greater, produced, for example, by gold, platinum, palladium, etc.) relative to that of the amorphous semiconductor film 65, which is assumed to be silicon in the exemplary form of the invention now being described. The metallic region 76 may be a single layer of a metal or it may be multi-layered. The amorphous semiconductor film 65 may have a thickness of about 1 micron. The metallic region 76 may have a thickness of about 100 Å in order to be semi-transparent to solar radiation.

On the surface of the metallic region 76 is deposited a grid electrode 84 made of a metal having good electrical conductivity. The grid may comprise orthogonally related lines of conductive material occupying only a minor portion of the area of the metallic region, the rest of which is to be exposed to solar energy. For example, the grid 84 may occupy only about from 5 to 10% of the entire area of the metallic region 76. The grid electrode 84 uniformly collects current from the metallic region 76 to assure a good low series resistance for the device.

An anti-reflection layer 80 may be applied over the grid electrode 84 and the areas of the metallic region 76 between the grid electrode areas. The anti-reflection layer 80 has a solar radiation incident surface 82 upon which impinges the solar radiation. For example, the anti-reflection layer 80 may have a thickness in the order of magnitude of the wavelength of the maximum energy point of the solar radiation spectrum, divided by 4 times the index of refraction of the anti-reflection layer 80. If the metallic region 76 is platinum of 100 Å thickness, a suitable anti-reflection layer 80 would be zirconium oxide of about 500 Å in thickness and an index of refraction of 2.1.

At the interface between the metallic region 76 and the amorphous semiconductor film 65, a Schottky barrier is formed which enables the photons from the solar radiation to produce current carriers in the film 65, which are collected as current by the grid electrode 84.

In addition to the Schottky barrier solar cell shown in FIG. 6, there are solar cell constructions which utilize p-n junctions in the body of the amorphous semiconductor film forming a part thereof formed in accordance with successive deposition, compensating or altering, and doping steps like that previously described. These other forms of solar cells are generically illustrated in FIG. 7. These constructions generally include a transparent electrode 85 through which the solar radiation energy penetrates into the body of the solar cell involved. Between this transparent electrode and an opposite electrode 88 is a deposited amorphous semiconductor film 65', preferably silicon, initially compensated or altered in the manner previously described. In this amorphous semiconductor film 65' are at least two adjacent regions 65a' and 65b' where the amorphous semiconductor film has respectively oppositely doped regions, region 65a' being shown as a n-conductivity region and region 65b' being shown as a p-conductivity region. The doping of the regions 65a' and 65b' is only sufficient to move the Fermi levels to the valence and conduction bands involved so that the dark conductivity remains at a low value achieved by the compensation or altering method of the invention. The film 65' has a high conductivity, highly doped ohmic contact interface regions 65c' and 65d' of the same conductivity type as the adjacent region of the film 65'. The film regions 65c' and 65d' contact electrodes 88 and 85, respectively.

Figure 8:
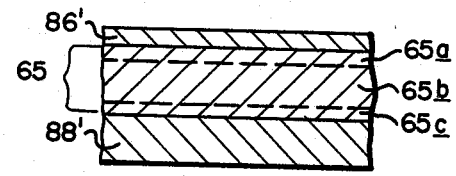
FIG. 8 is a fragmentary sectional view of a photodetection device which includes an amorphous semiconductor film of the invention.

Refer now to FIG. 8 illustrating another application of an amorphous semiconductor film utilized in a photodetector device whose resistance varies with the amount of light impinging thereon. The amorphous semiconductor film 65 thereof is compensated or altered in accordance with the invention, has no p-n junctions as in the embodiment shown in FIG. 7 and is located between a transparent electrode 86' and a substrate electrode 88'. In a photodetector device it is desirable to have a minimum dark conductivity and so the amorphous semiconductor film 65 has an undoped and compensated or altered region 65b and heavily doped regions 65a and 65c of the same conductivity type forming a low resistance ohmic contact with the electrodes 88' and 86', which may form a substrate for the film 65.

Figure 9:
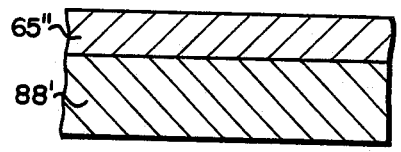
FIG. 9 is a fragmentary sectional view of a Xerox drum including an amorphous semiconductor film of the invention.

Refer now to FIG. 9 which shows an electrostatic image-producing device (like the drum of a Xerox machine) where it is desirable to have a low dark conductivity in an undoped amorphous semiconductor film 65' thereof which is compensated or altered in accordance with the present invention. The electrostatic image-producing device is deposited on a substrate 88'.

Figure 10:
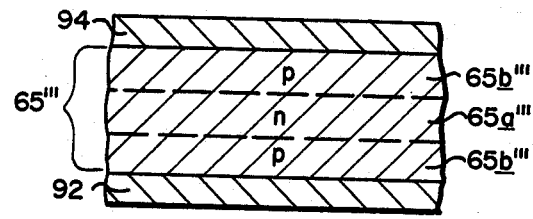
FIG. 10 is a p-n-p transistor-like device including an amorphous semiconductor film of the invention.

Reference should now be made to FIG. 10 which shows a p-n-p current control device having outer electrodes 92 and 94 on the opposite faces of a film 65' of an amorphous semiconductor material like silicon, compensated or altered in accordance with the invention. The amorphous semiconductor film 65" has outermost p-doped regions and 65b''' and a preferably doped base-forming intermediate region 65a''' of n-conductivity type. If the device is to form a transistor, a terminal connection is made to the base-forming region 65a''' of the film.

Figure 11:
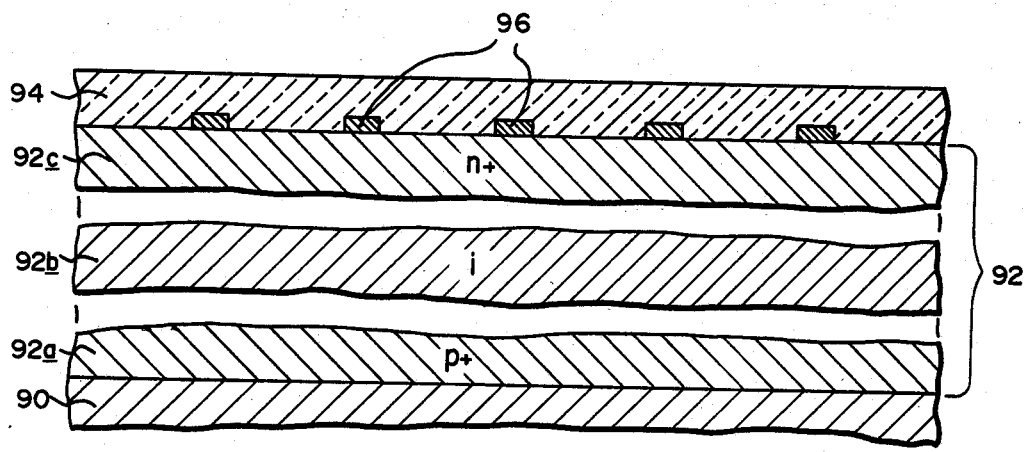
FIG. 11 is a fragmentary sectional view of a p-i-n solar cell illustrating a further form of the invention.

FIG. 11 shows a p-i-n solar cell in fragmentary cross-section. The solar cell illustrated includes a substrate 90 of a material having both good electrical conductivity properties, and the ability of making an ohmic contact with an amorphous silicon film 92 compensated or altered with at least fluorine or also preferably hydrogen to provide a low density of localized defect states in the energy gap. The substrate 90 may comprise a low work function metal, such as aluminum, tantalum, stainless steel or other material matching with the amorphous semiconductor film 92 deposited thereon, which is preferably silicon, compensated or altered with fluorine and also preferably hydrogen in the manner of the silicon films previously described so that it has a minimum density of localized defect states in the energy gap of no more than about $10^{16}$ per cubic centimeter per eV and preferably has an ohmic contact providing region 92a'. The film 92 has an ohmic contact-providing region 92a next to the substrate 90, which region is shown having a p-plus conductivity (i.e. it is a heavily doped region) to form a low resistance interface between the substrate 90 and an undoped depletion layer-forming region 92b which forms the photon-absorbing layer of the solar cell. Next to the intrinsic region 92b is a heavily doped n-plus region 92c. This region 92c is so thin as to be transparent or semi-transparent to solar radiation.

Figure 12:
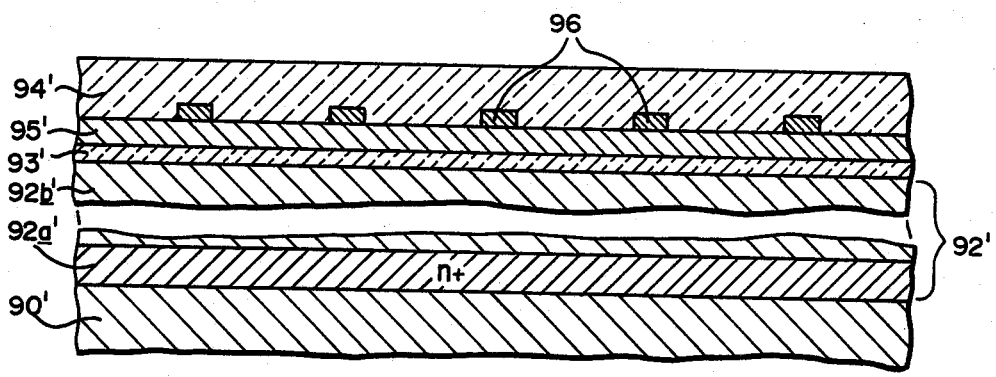
FIG. 12 is a fragmentary sectional view of a m-i-s solar cell forming a still further form of the invention.

FIG. 12 shows a m-i-s solar cell in fragmentary cross-section. The solar cell illustrated includes a substrate 90, previously described of a material having both good electrical conductivity properties and the ability of making an ohmic contact with an amorphous silicon film 92' compensated with at least fluorine and also preferably hydrogen.

The film shown has an ohmic contact-providing region 92a next to the substrate 90, the region 92a' being shown as being a heavily doped n-plus region which forms a low resistance interface between the substrate 90' and an intrinsic region 92b'. Upon the amorphous film 92' is a thin solar energy transparent insulating layer 93' which, for example, may be made of a titanium dioxide or silicon dioxide. Upon the insulating layer 93' is deposited a high-work function metal barrier film 95' like the barrier-forming layer 76 in the Schottky barrier device on FIG. 6. Deposited upon the barrier-forming layer 95' are a grid electrode 96' and an anti-reflection layer 94', like the corresponding grid and layer 84 and 82 of FIG. 6.

The thicknesses of the layers of the various devices shown in FIGS. 6 through 12 may vary widely. However, typical thicknesses for the layer forming regions of the amorphous films involved are of the order of magnitude of, for example, about 5000 Angstroms. The various adjacent regions of the films have thicknesses of the order of magnitude of about 100 to 200 Angstroms. Typical thicknesses of the anti-reflection layers is about 800 Angstroms. The insulating layer 93' in the m-i-s device of FIG. 12 is of the order of magnitude of about 20 Angstroms.

In summary, the present invention makes possible the practical utilization of amorphous semiconductor bodies in the making of a variety of devices which can be made solely of deposited amorphous semiconductor and metal films heretofore not believed possible because of the assumed difficulty of lowering the density of localized states of amorphous semiconductor films to values where sufficiently long diffusion lengths and good doping and other film modification capabilities are achieved.

It is understood that numerous modifications may be made in the various preferred forms of the invention described, without deviating from the broader aspects thereof.

In the claims, when a reference is made to a "film", such expression is intended to cover a layer of material formed in a single process step or a multiplicity of layers of or similar material which may be formed sequentially in the same or different environments.

I claim:

1. An electrostatic image-producing device, the device including an improved amorphous semiconductor body formed from a solid host matrix of amorphous semiconductor alloy material; the amorphous semiconductor of said amorphous semiconductor alloy material selected from the group consisting essentially of silicon, germanium or mixtures thereof; said amorphous semiconductor alloy material disposed upon an electrically conductive substrate and having electronic configurations with an energy gap; said host matrix of the amorphous semiconductor alloy material further including at least one compensating material for reducing the density of localized states in said energy gap.

2. A device as in claim 1, wherein a plurality of different and complementary compensating materials are introduced into said film, said materials selected so that at least one is adapted to reduce said localized states at or near the Fermi level and another is adapted to reduce said localized states between those at or near said Fermi level and either the conduction or valence bands thereof.

3. A device as in claim 1, wherein said host matrix includes at least silicon.

4. A device as in claim 2, wherein said host matrix includes silison and said plurality of compensating materials include at least hydrogen and fluorine.

5. A device as in claim 1, wherein said host matrix includes at least germanium.

6. A device as in claim 2, wherein said host matrix includes germanium and said plurality of compensating materials include at least hydrogen and fluorine.

7. A device as in claim 1, wherein said host matrix includes at least silicon and germanium.

8. A device as in claim 2, wherein said host matrix includes silicon and germanium and said plurality of compensating materials include at least hydrogen and fluorine.

* * * * *